United States Patent [19]

Kinzler

[11] Patent Number: 4,620,165

[45] Date of Patent: Oct. 28, 1986

[54] ELECTRICAL SUPPRESSOR FILTER

[75] Inventor: Hans Kinzler, Regensburg, Fed. Rep. of Germany

[73] Assignee: Siemens Aktiengesellschaft, Berlin and Munich, Fed. Rep. of Germany

[21] Appl. No.: 563,905

[22] Filed: Dec. 21, 1983

[30] Foreign Application Priority Data

Dec. 22, 1982 [DE] Fed. Rep. of Germany ....... 3247546
Mar. 29, 1983 [DE] Fed. Rep. of Germany ....... 3311443

[51] Int. Cl.$^4$ .......................... H03H 7/01; H02B 1/10
[52] U.S. Cl. .................................... 333/167; 335/185; 361/331
[58] Field of Search ............................... 333/167–177, 333/181–185; 361/331, 332, 380, 395, 397, 399, 403, 415, 417, 427; 174/68.5

[56] References Cited

U.S. PATENT DOCUMENTS

| | | | |
|---|---|---|---|
| 3,069,958 | 12/1962 | Daily et al. | 361/415 |
| 3,251,015 | 5/1966 | Denham | 333/185 X |
| 3,678,419 | 7/1972 | Boulin et al. | 333/185 |
| 4,163,956 | 8/1979 | Garlington et al. | 333/184 X |
| 4,196,467 | 4/1980 | Jakob et al. | 361/399 |
| 4,408,171 | 10/1983 | Akino et al. | 333/177 |
| 4,451,803 | 5/1984 | Holdsworth et al. | 333/12 |

FOREIGN PATENT DOCUMENTS 1587175  2/1970  France .
820687  9/1959  United Kingdom .

OTHER PUBLICATIONS

JEE Journal of Electronic Engineering, Band 18, Jr. 174, Jun. 1981, Tokyo (JP), S. Satoh "Noise Reduction Measures Increasingly Necessary", pp. 38–42.

Primary Examiner—Marvin L. Nussbaum
Attorney, Agent, or Firm—John Francis Moran

[57] ABSTRACT

An electrical suppressor filter is disclosed which has a filter housing, a circuit board arranged within the housing, electrical components electrically connected to the circuit board and power connection plugs extending through the housing wall and electrically connected to the circuit board. The power connection plugs have integral legs extending into the interior of the housing which are both mechanically and electrically connected to the circuit board.

14 Claims, 8 Drawing Figures

I  II

ELECTRICAL SUPPRESSOR FILTER

BACKGROUND OF THE INVENTION

The invention relates to an electrical suppressor filter having a filter housing with a housing cover and a circuit board arranged within the housing. The circuit board is equipped and wired with electrical components, such as capacitors and inductors which are embedded in sealing compound, and is electrically connected to power connection plugs in the housing wall.

In conventional suppressor filters of this kind, the filter housing bottom is attached—e.g., welded—to a base plate equipped with fastening straps to fasten a circuit board within the housing. Depending on their number, the electrical components of the suppressor filter are wired and arranged on the circuit board either individually or by means of soldering frames. The suppressor filter inputs and outputs are connected to power connection plugs which are preferably disposed in the housing wall. The power connection plugs may be designed as appliance plugs or flat plugs. The ground wire connector fastened to the housing is also usually a flat plug or lug, and may be welded to the outside housing wall.

SUMMARY OF THE INVENTION

It is an object of the present invention to provide a suppressor filter of the kind described above which due to its design—and more particularly due to the special design of its individual active and passive components—can be produced in a simple and cost-saving manner.

It is a further object of the present invention to provide a suppressor filter which is well suited for the formation of entire suppressor filter banks in a so-called "building block" system.

These objects, as well as other objects which will become apparent from the discussion that follows, are achieved, according to the present invention, by providing an electrical suppressor filter having a filter housing, a circuit board arranged within the housing, electrical components electrically connected to the circuit board and power connection plugs extending through the housing wall and electrically connected to the circuit board. In this filter, the power connection plugs have integral legs extending into the interior of the housing which act as supporting elements for the circuit board. The circuit board has electrical conductors in its interior or on its surface which are electrically connected to the legs.

The power connection plugs may be designed, for instance, as L-shaped flat plugs whose legs, disposed within the filter housing, are selectively in electrical contact with the circuit board conductors and serve as mechanical supports for the circuit board. If the power connection plugs are designed as appliance plugs, their plug pin legs disposed in the filter housing preferably extend at right angles to the outwardly directed plug pins.

In a preferred form of the invention the ends of the plug pin legs disposed in the filter housing are stepped and inserted in slots in the circuit board so that their recessed face edges serve as resting points for the circuit board and their protruding portions, inserted within the slots, are electrically connected (e.g., soldered) to circuit board conductors.

When assembling the suppressor filters according to the invention, the electrical components are first mounted on the circuit board. This circuit board is expediently designed with holes for the terminal elements (pins) of the electrical components. The terminals of the components are then electrically connected to the circuit board conductors, for example by wave soldering. The circuit board thus assures that the configuration of the electrical components and the air and leakage paths meet the high-frequency requirements. The component-equipped circuit board is next plugged onto the ends of the plug pin legs disposed in the filter housing such that the components face the housing interior and the surface conductors are accessable to the assembler. This makes it possible to easily provide electrical contact between the leg ends inserted in the circuit board slots and the circuit board conductors. The plug pin legs, whose free face ends are stepped and inserted in corresponding, matched circuit board slots, may also have a semicircular cross-section.

If, as discussed above, the circuit board is disposed adjacent to the open side of the filter housing which is then closed by a housing cover, the suppressor filter Y-capacitors that serve to shunt high-frequency interference currents can be connected to ground via the shortest possible distance. Such an arrangement results in an optimal suppression.

The Y-capacitors are advantageously connected to ground or the housing wall via flexible, band-shaped copper strips having one end which makes contact with the appropriate circuit board conductors and an opposite end which is folded over the open face edges of the filter housing. The strips are thus clamped between the housing box and the housing cover and, in addition, are preferably electrically connected to either the housing box or the housing cover by ultrasonic welding.

Since the circuit board makes possible exact alignment of the various electrical components relative to each other, the suppressor filter can be equipped with non-commercial capacitors, i.e. with so-called "bare windings", meaning capacitors not inserted in separate and sealed cans.

In addition to its holes for the power connection elements, the circuit board is advantageously equipped with additional, larger holes through which the sealing compound, such as synthetic resin, and the filler, such as quartz sand, can be easily poured into the housing box. In this process the circuit board prevents the still liquid sealing compound from overflowing and thereby wetting the open rim area of the filter housing. The presence of sealing compound on the rim is a disturbing factor when subsequently welding the housing cover to the housing box.

In contrast to the suppressor filter housings heretofore known, the housing cover is preferably provided with integral fastening straps having holes to hold the suppressor filter to a chassis, for example. Depending upon the desired alignment of the suppressor filters, the fastening straps may be disposed either in parallel with, or transverse to the longitudinal direction of the housing.

A suppressor filter bank that is rated, for example, in the range of 1 to 20 amperes and constructed with different electrical components for different attenuations should be fabricated as economically and uniformly as possible for medium and small-sized lots. In order to meet this requirement, the location of the electrical connection and the fastening means for the filter housing should be variable.

For the production of entire suppressor filter rows in the so-called "building block" system,—i.e., for the production of suppressor filter banks consisting of individual suppressor filters of different attenuation—it is preferred, therefore, that the filter housing boxes, housing covers and circuit boards of the suppressor filters of each bank have the same width but a different length, depending upon the attenuation and, hence, the number of components required; that the plane of the housing cover fastening straps be parallel to and offset but equidistant from the housing cover plane; and that the length of the plug pin legs disposed inside the filter housing and the distance between the power connection plug housing wall openings and the filter housing face walls each be selected so that the circuit boards of all suppressor filters of a bank are equidistant from their respective housing covers.

Adhering to this requirement leads to considerable production simplifications; in particular, the fixtures and tools required to produce the suppressor filters can be kept to a minimum and employed with optimum effectiveness.

For a full understanding of the present invention, reference should now be made to the following detailed description of the preferred embodiments of the invention and to the accompanying drawings.

DESCRIPTION OF THE PREFERRED EMBODIMENTS

Figure 1:
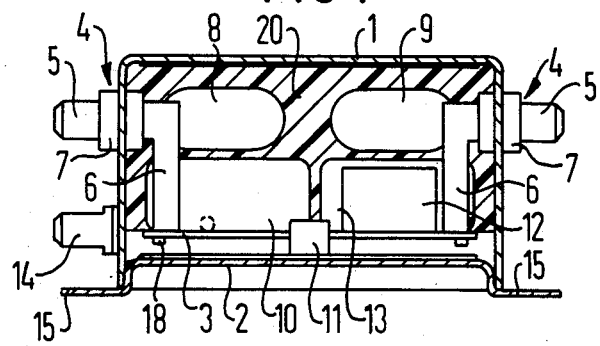
FIG. 1 is a side view of a first preferred embodiment of a suppressor filter according to the invention, shown partly in section.
Figure 2:
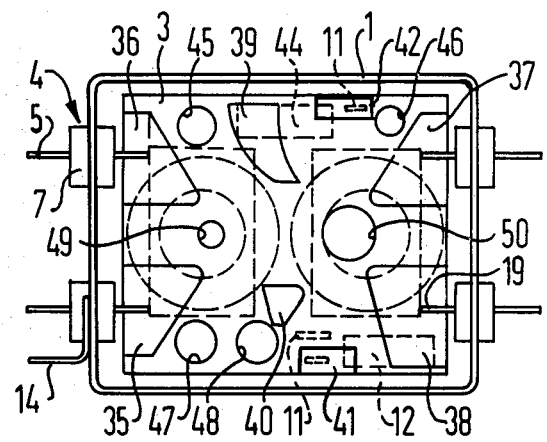
FIG. 2 is a top view of the suppressor filter according to FIG. 1, with the housing cover removed and electrical components thereof indicated in dashed lines.
Figure 5:
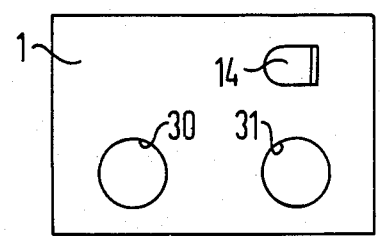
FIG. 5 is a side view of the filter housing for the suppressor filter of FIGS. 1 and 2, showing only the ground wire flat plug connection.

The suppressor filter shown in FIGS. 1 and 2 has a filter housing 1 and a housing cover, 2 both made of aluminum, a material which is inexpensive and also exhibits good high-frequency characteristics. A ground wire flat plug connector 14 is expediently fastened in all suppressor filters in the same place on the filter housing 1, as is shown in FIG. 5. From the aspect of production engineering this eliminates the need to retool for different fastening positions of the flat plug connector.

Figure 3:
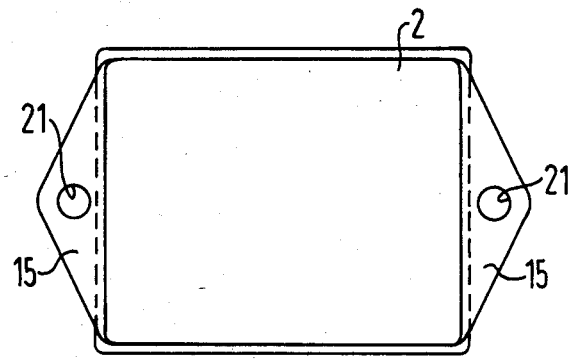
FIG. 3 is a top view of the housing cover for the suppressor filter of FIGS. 1 and 2.
Figure 4:
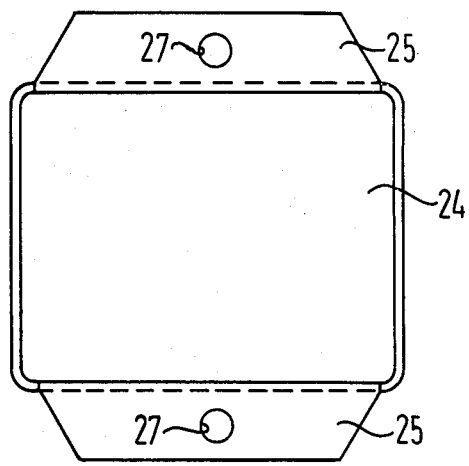
FIG. 4 is a top view of a housing cover according to a modified embodiment of the invention.

As shown in FIGS. 1 and 3, fastening straps 15 are integrally connected to the housing cover 2 and provided with holes 21 for fastening the suppressor filter to a supporting surface such as a chassis. Optionally, this housing cover may be replaced by the housing cover 24 shown in FIG. 4 which has fastening straps 25, including holes 27, rotated by 180° with respect to the straps 15 of the cover 2.

Inserted in holes 30, 31 (see FIG. 5) in opposite sidewalls of the filter housing 1 and held by insulators 7 are L-shaped flat plugs 4 with legs 5, 6. In addition to being power terminals, the legs 6 also mechanically support a circuit board 3. The free ends of the legs 6 are stepped for this purpose, and their projecting face edges 18 are each inserted in slots 19 of the circuit board 3 so as to serve as supports for the circuit board 3.

On its surface facing the housing cover 2, the circuit board 3 carries conductors 39, 40, 41 and 42 as well as conductors 35, 36 37, 38 which are electrically connected to the legs 6 of the flat plugs 4. In the conductor areas, the circuit board 3 has openings for the terminal elements of the electrical components, namely, capacitors 8, 9, toroidal core inductors 10, 13 and Y-capacitors 12, 44. The Y-capacitors 12, 44, which serve to shunt high-frequency interference currents, are grounded via the conductors 41, 42 and via flexible, band-shaped copper straps 11 in electrical contact with these conductors. These copper straps 11 are led out of the interior of the filter housing, clamped between the edges of the filter housing 1 and the housing cover 2, and connected electrically to the filter housing 1 or housing cover 2 by ultrasonic welding.

To embed the components of the suppressor filter in a sealing compound 20, the circuit board 3 is provided with openings 45, 46, 47, 48, 49 and 50 whose configuration and size are selected so that the sealing compound, such as casting resin, and the filler, such as quartz sand, can be poured into the housing without difficulty.

Figure 6:
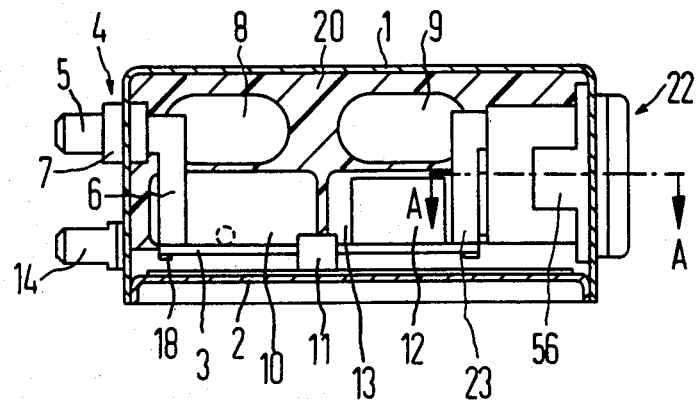
FIG. 6 is a side view of a second preferred embodiment of a suppressor filter according to the invention, shown partly in section.
Figure 7:
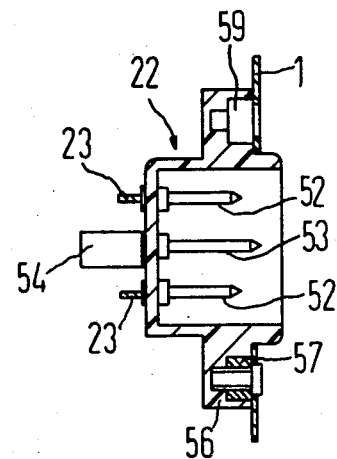
FIG. 7 is a cross-section taken along the line AA in FIG. 6 of an appliance plug designed in accordance with the invention.

In the preferred embodiment shown in FIGS. 6 and 7 the parts that are identical to those in the embodiment described above are designated with the same reference numerals. The flat plugs 4 shown on the right-hand side of FIG. 1 are replaced by an appliance plug 22. Molded integrally with this appliance plug 22 are extensions 56 with blind holes 59 in which are embedded tapped bushings 57.

The tapped bushings 57 are riveted flush against openings of the filter housing 1 so that the appliance plug 22 is firmly joined to the filter housing 1. The legs 23, 54 of the plug pins 52, 53 of the appliance plug, disposed inside the filter housing, are designed as flat plugs in this embodiment. As is the case in the embodiment per FIGS. 1, 2, the free ends of the legs 23 are also stepped and inserted in appropriate slots in the circuit board 3 so that their recessed face edges serve as supports for the circuit board 3. Corresponding to the flat plug 14 in the embodiment of FIGS. 1 and 2, the lug 54 also serves as a ground wire terminal which is electrically connected to the filter housing 1, for example, by ultrasonic welding.

The suppressor filters described above are excellently suited for mass production and, in particular, for the production of entire suppressor filter banks in a so-called "building block" system. The assembly, especially also the establishment of electrical contact between the power connection plug and the circuit board and the attachment of the copper straps to the filter housing, is simple and capable of being fabricated without much retooling, even when different suppressor filter banks are involved.

Figure 8:
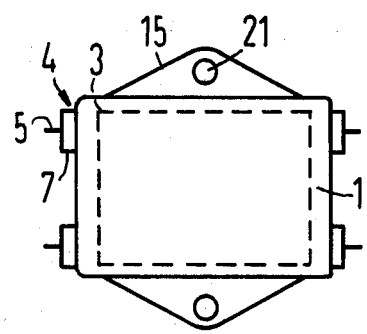
FIG. 8 is a top view of two suppressor filter banks of filters shown in FIG. 1 to 7.
Figure 8:
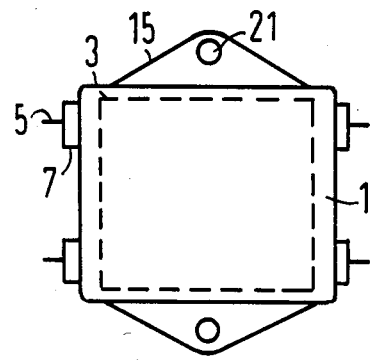
Figure 8:
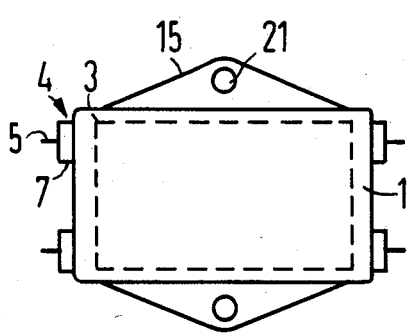
Figure 8:
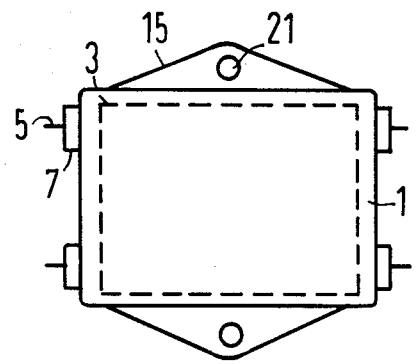
Figure 8:
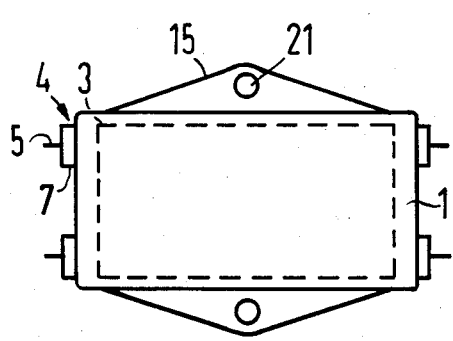
Figure 8:
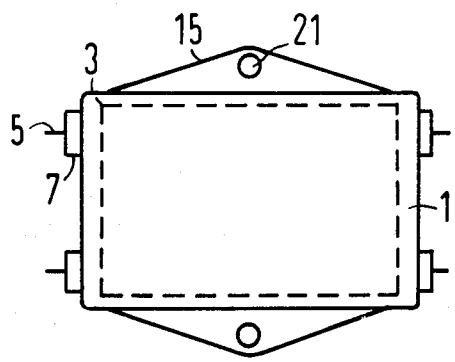

Suppressor filter banks according to the above mentioned "building block" system are shown in FIG. 8. Each filter bank I and II comprises a plurality of filters according to FIGS. 1 to 7, wherein said filters having differing attenuation characteristics defined by the electrical components therein. Housings 1 and circuit boards 3 of all filters of a single filter bank have the same width but different length depending upon the respective attenuation characteristics of the single filter. The housing cover 2 of each filter has integral strap-like extensions 15 (FIG. 3) and 25 respectively (FIG. 4) for fastening said housing 1 to supporting surface not shown in the drawings. The extensions 15 and 25 respectively lie in a plane which is offset and parallel to the plane of said housing cover 2.

The distance between said circuit board 3 and said housing cover 2 is the same in each of said filters of a filter bank. This distance being defined by the length of the legs 6 of the plugs 4 and the positions of the openings (see FIG. 5) 30, 31 in said housing wall for penetration of said power connection plugs 4.

There has thus been shown and described a novel electrical suppressor filter which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. An electrical suppressor filter comprising: a filter housing including a housing cover, a circuit board located within the housing, and electrical components electrically connected to the circuit board, power connection plugs mounted in the housing wall, said power connection plugs having integral legs that are flat and L-shape and extend through said housing wall into the interior of said housing; said circuit board being adapted to fit over the end portion of said legs; and said circuit board having electrical conductors which are electrically connected to said legs and said circuit board is supported by said legs before the housing cover is mounted on the filter housing.

2. The filter defined in claim 1, wherein a sealing compound occupies the region between the housing and the printed circuit board, and the region includes the electrical components.

3. The filter defined in claim 1, wherein at least one of said power connection plugs is constructed as an appliance plug having at least one plug connector, said plug connector having a plug pin extending outwardly with respect to said housing and a flat leg integral with and extending within said housing at a right angle to said plug pin.

4. The filter defined in claim 1, wherein said legs of said power connection plugs have stepped ends, each forming a projection extending from a face edge of the corresponding end, and wherein said projections at the ends of said legs are inserted in slots in said circuit board with said face edges serve as supports for said circuit board.

5. The filter defined in claim 4, wherein said projections inserted in said slots of said circuit board are soldered to said electrical conductors of said circuit board.

6. The filter defined in claim 1, wherein said legs are soldered to said electrical conductors of said circuit board.

7. The filter defined in claim 1, wherein at least one Y-capacitor is mounted on said circuit board for shunting high-frequency interference currents, said Y-capacitor being grounded via an electrical conductor on said circuit board and a flexible, band-shaped, conductive strap extending out of the housing interior from said electrical conductor and connected electrically with said housing.

8. The filter defined in claim 7, wherein said housing includes a housing box and a housing cover, and wherein said conductive strap is clamped between said box and said cover.

9. The filter defined in claim 7, wherein said conductive strap is ultrasonically welded to said housing.

10. The filter defined in claim 7, wherein said strap is made of copper.

11. The filter defined in claim 1, wherein said housing is shaped in a box and said cover has integral extensions with holes therein for fastening said housing to a supporting surface.

12. A suppressor filter bank comprising a plurality of filters as defined in claim 1, wherein said filters have differing attenuation characteristics defined by the electrical components therein, wherein said housings and said circuit boards of said filters all have the same width but have different lengths depending upon the respective attenuation characteristics of said filters.

13. The filter bank defined in claim 12, wherein said housing of each filter comprises a housing box and a housing cover, said housing cover having integral, strap-like extensions for fastening said housing to a supporting surface, and wherein said extension lie in a plane which is offset and parallel to the plane of said housing cover.

14. The filter bank defined in claim 13, wherein the distance between said circuit board and said housing cover is the same in each of said filters, this distance being defined by the lengths of said legs and the positions of the openings in said housing wall for penetration of said power connection plugs.

* * * * *